United States Patent [19]

Perretta

[11] Patent Number: 4,977,483

[45] Date of Patent: Dec. 11, 1990

[54] ELECTRONIC COMPONENT STORAGE ALBUM

[76] Inventor: Louis A. Perretta, P.O. Box 59, Newton Highlands, Mass. 02161

[21] Appl. No.: 356,555

[22] Filed: May 25, 1989

[51] Int. Cl.$^5$ .............................................. H05K 5/00
[52] U.S. Cl. ................................... 361/424; 206/328; 206/332; 220/2.3 R
[58] Field of Search .................... 220/1 A, 2.3 R, 470; 206/328, 329, 331, 332, 334; 364/424; 361/380, 395

[56] References Cited

U.S. PATENT DOCUMENTS 4,241,829 12/1980 Hardy ................................. 206/328
4,333,565 6/1982 Woods ................................. 206/329

Primary Examiner—Roy N. Envall, Jr.
Attorney, Agent, or Firm—Wolf, Greenfield & Sacks

[57] ABSTRACT

An electronic component storage album consisting of integrally secured front and rear covers adapted to snap together to define a sealed compartment. An electrically conductive foam block is secured in the compartment against the inner side of the back cover to support a plurality of electronic components such as ICS which are secured by impaling their pins in the block. If desired a recess may be formed on the inner side of the front cover to receive and support a plurality of diskettes or other documentation.

7 Claims, 2 Drawing Sheets

ELECTRONIC COMPONENT STORAGE ALBUM

SUBJECT MATTER OF INVENTION

The present invention relates to an electronic component album and in particular to means for storing and transporting electronic components.

BACKGROUND OF INVENTION

Semiconductor components are used in the wide array of applications for computers, controllers, testers, measuring devices and the like. During manufacture, design and repair of these devices the components are subject to a variety of physical and electrical influences which may permanently damage or alter their characteristics. In particular, rough handling or exposure of these components to transient electrical influences will alter their performance and may render them totally useless for their originally intended purpose. The physical influences which may damage these components include excess mechanical vibration and shock, exposure to moisture or other materials such as solvents and debris, excessive temperature excursions, and the like. These components are also subject to damage from excessive potential voltage applied directly or induced in the component. Thus, for example, the direct application of excessive potential voltage between different pins or leads on a semiconductor memory device may result in the destruction of a portion of the device resulting from the applied potential. Induced potential voltage within a memory device may also erase portions of stored data.

Heretofor, there have been no commercially available storage systems that maximize protection of such electronic components using the features of this invention in a compact, efficient and commercially viable embodiment. For the most part, informal carrying devices are used in many engineering facilities or other locations in which these electronic components are handled. For example, magazines having slides, tubes or rails are often used. Such units do not lend themselves to convenient storage and accessibility of electronic components. Occasionally, electronic components are loosely held in boxes or in various shaped and sized molded trays. None of these products, however, are fully satisfactory or achieve the results or provide the advantages of the present invention.

SUBJECT MATTER OF INVENTION

It is an object of the present invention to provide a unique storage system which protects electronic components such as semiconductors from physical and electrical damage to which they may be susceptible, as well as to provide a storage system that enhances the organization, presentation and retrieval of such components.

A further object of the present invention provides an electronic component storage means for facilitating the storage, handling, and transportation of components such as semiconductor chips and the like. The system of the present invention enhances handling, dispensing, use and identification of stored components while affording ideal electrical and physical protection of the components In the present invention there is provided improved means for protecting stored electronic components from triboelectric charges that are generated by frictional movement or separation of two surfaces, which is often generated in storage systems heretofor in use.

A further object of the present invention is to provide a system in which the pins or leads of stored components are protected from differential voltage application while stored. Elimination of potential charges across the leads precludes damage to the component. In one embodiment of present invention electronic components are protected from electromagnetic interference through the electrostatic shielding of the component by enclosing the electronic components in a Faraday cage or electrostatic shield.

One further object of present invention is to provide a storage system in the form of an album which physically protects both the pins and body of components from damage by securing the pins in a firm, high density foam material secured within a crush resistant compartment. One more object of the present invention is to provide an improved storage system in the form of an album for electronic components in which the components are stored in a compartment defined by interlocking components of the album that provides an essentially sealed compartment that precludes inadvertant contacts with airborn particulates, damaging oils or solvents.

One further object of the present invention is to provide an improved storage system for electronic components in the shape of an album having a book-like outer configuration and which is easy to store and use. Each album is adapted to be stored in book-like fashion on a shelf with readily visible content identification on the outer surfaces of the album.

These and other objects and advantages of the present invention are achieved in an album having front and back covers with means for releasably securing the covers together in the form of continuous interlocking sidewalls secured respectively to the front and back covers to form a compartment therebetween and with an electrically conductive foam block positioned within the compartment adapted to support the pins or leads of electronic components.

DESCRIPTION OF DRAWINGS

The foregoing objects and advantages of the present invention will be more clearly understood in connection with accompanying drawings in which.

DETAILED DESCRIPTION OF PREFERRED EMBODIMENT

Figure 1:
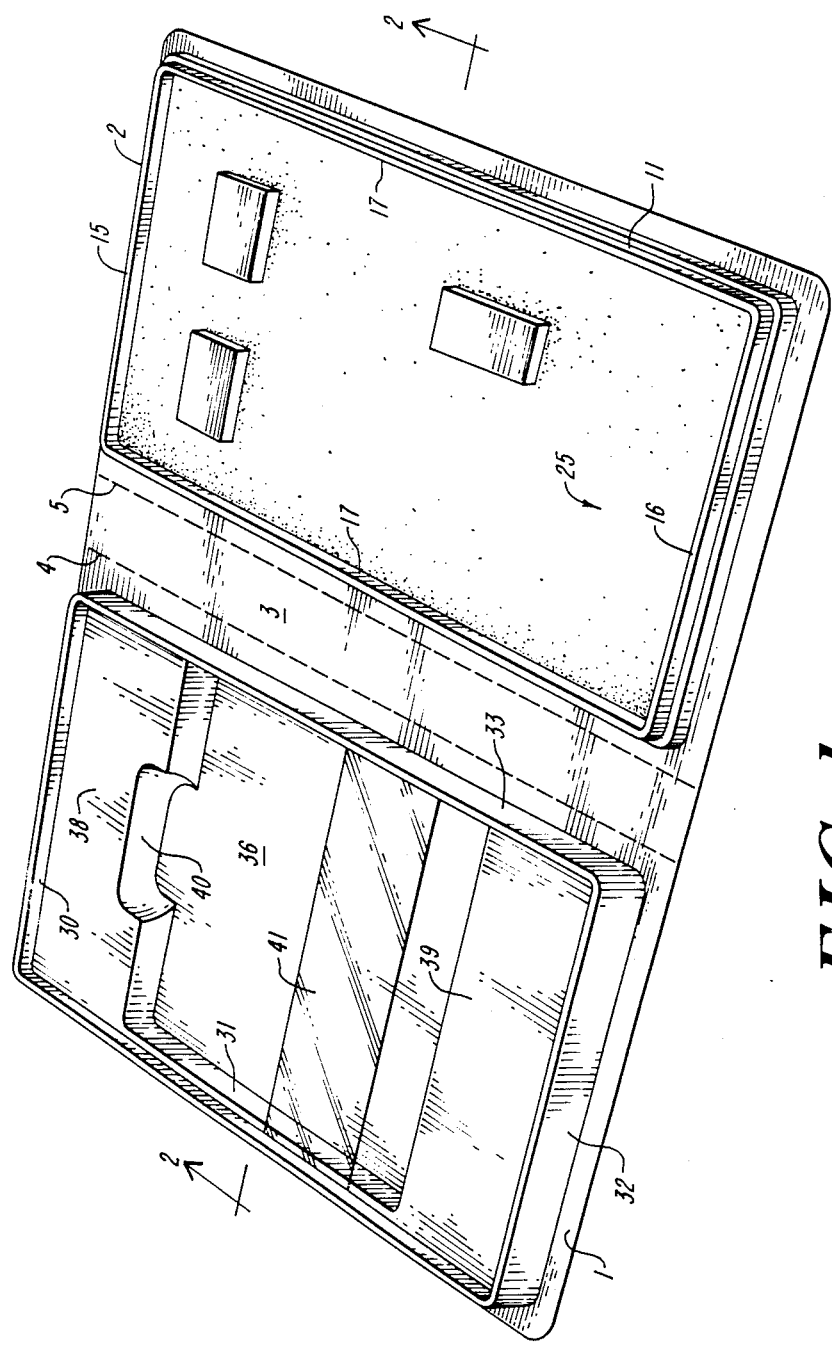
FIG. 1 is a perspective view of an electronic component storage album in open position illustrating the invention.
Figure 2:
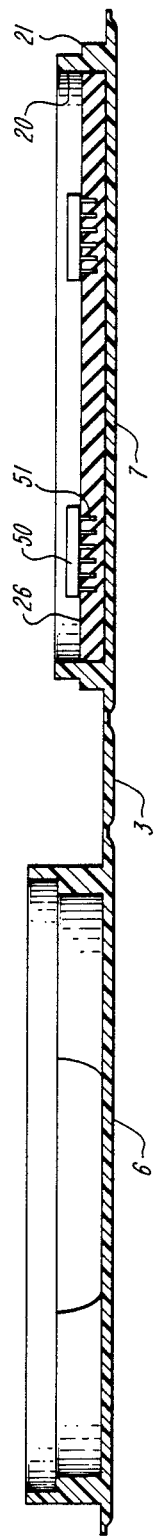
FIG. 2 is a cross-sectional view taken along the line 2—2 of FIG. 1.

The electronic component storage album illustrated in the drawings has an overall appearance when closed that is similar to a conventional album. The album includes a front cover 1 and back cover 2 integrally joined by a central web 3 that is defined from the front and back covers respectively by fold lines 4 and 5. The web 3 forms a spine of the album. The outer sides 6 and 7 of the covers may be suitably formed together with the web or spine 3 to simulate a book, and accordingly may be suitably embossed or printed with appropriate legends.

Continuous flanges or sidewalls 10 and 11 are formed respectively on the inner sides of the front cover 1 and back cover 2. These continuous sidewalls 10 and 11 may be suitably formed as the cover from suitable elastic material by thermal forming or vacuum forming techniques with the sidewalls heat sealed or otherwise secured to the inner sides of the front and back covers 1 and 2. In cross section the continuous sidewall 11 is formed with upper 15 lower 16 and lateral 17 continuous sections. In cross section the sidewalls 11 are formed with an inner wall 20 and an outer stepped surface 21 connected by the top surface 22. The inner wall 20 of the continuous sidewall defines a compartment or recess 25 which is preferably substantially, but not necessarily, rectangular in shape Means are provided in this recess for releasably engaging and securing electronic components. These means preferably comprise a conductive foam block 26 which has a bottom side secured in facing relation to the inside of the back cover 2 and the other side recessed from the top surface 22 to partially define the compartments or recess 25.

The conductive sidewall 10 which is secured to the inner side of the front cover includes continuous walls 30, 31, 32 and 33. Preferably the outer side of these walls 30, 31, 32 and 33 are planar and have a depth greater than the depth of the continuous sidewall 11. These walls 30, 31, 32 and 33 define a recess 36. Within the walls of the 30, 31, 32 and 33 and integrally formed with their inner side are upper and lower shoulders 38 and 39. These shoulders 38 and 39 are shaped and spaced to form the recess 36, preferably with dimensions suitable for receiving standard floppy disks (not shown) in a stacked array. In this connection, shoulder 38 may be formed with a finger recess 40 to permit and facilitate removal or insertion of the floppy disks. A flexible strap 41 preferably formed of plastic spans the recess 36 at its upper edge with the strap secured at either end. The strap should be somewhat flexible and loose to permit insertion under it of one or more floppy disks. The strap functions to retain the disks in position without permitting them to inadvertently slip from the recess 36. Another embodiment of this "diskette" side has a clear, antistatic plastic window formed to "snap fit" over the top of cavity 36, performing the same function as the strap (i.e. retaining diskettes) but adding features of safety and allowing the storage of other materials (documents) while electrically isolating them from the opposing cavity.

Figure 3:
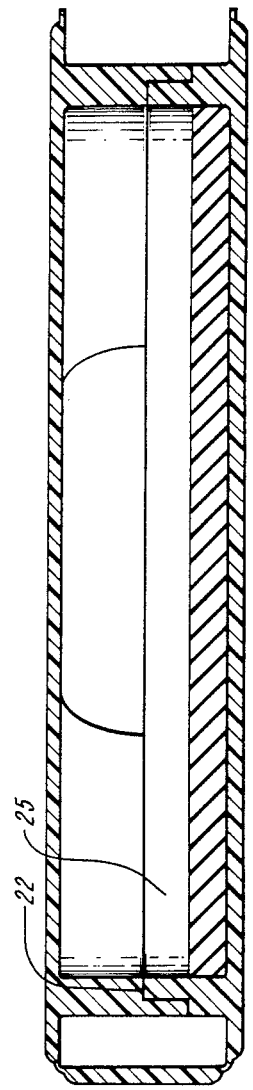
FIG. 3 is a cross-sectional view also taken substantially along the line 2—2 of FIG. 1 but with the album in a closed position.

The dimensions of the continuous sidewalls of 10 and 11 and their respective cross section are such as to permit the front cover to be folded over into engagement with the back cover. In this arrangement, best illustrated in FIG. 3, the inner sidewall 10 engages the outer periphery of the sidewall 11 by a suitable means such as by a detente means providing locking action or by frictional engagement to define the compartment or recess 25.

The album as described is intended for use with electronic components preferably of the type that are formed with projecting prongs or pins, including, for example, components such as integrated circuits and hybrids in a variety of shapes and sizes. In this arrangement the typical component 50 is secured with its pins 51 pressed into and frictional encased within the conductive, noncorrosive foam block. The foam block is preferably a conventional plastic foam that is conductive, noncorrosive and abrasive and solvent resistant. The components may be arranged in any selected configuration or in any combination. The compartment or recess formed by the album when closed has sufficient height to receive the entire array of components secure against the conductive foam block 26, with the top of the components spaced from the inner side of the front cover 1. In this specific embodiment illustrated in the drawings, a plurality of floppy disks may be secured in the recess 36 under the strap 41, spaced from related chips.

The album may be formed in a variety of sizes including for example, 7"×10". Such an arrangement may reasonably support 35 24 pin ICS together with a plurality of 5¼" or 3½" diskettes under the strap 41. Other embodiments are contemplated, including one in which foam blocks are provided both in the front and in the back cover 2 or a tray especially designed for LCC or other leadless components. The invention also contemplates smaller sized albums including one 5"×6" to hold 30 or more 24 pin ICS integrated circuits. Such a size is particularly convenient for transporting integrated circuits in a briefcase, while an even smaller unit having and outer diameter of 3"×4" may support six or more integrated circuits. Such a size is convenient for carrying the album in a suit pocket.

The material selected for the outer surfaces of the front and rear cover is preferably a vinyl plastic which is secured to a chipboard backing. Molded trays are secured to the other side of the chipboard to form the inner surfaces of the cover. The assembly is suitably sealed as for example by heat welding to provide a crush resistant, light-weight, inexpensive album. Additionally, if desired, the covers may be formed of an electrically conductive material to provide additional protection against electromagnetic interference to the stored electronic components that may be sensitive to such potential harm.

The conductive foam block provides protection from triboelectric charge which is an electrical charge generated by frictional movement on separation of two surfaces which might otherwise be generated by the use of inappropriate carrier material. Additional protection from such triboelectric charge may be enhanced by using conductive front and back covers as well as a conductive foam block.

Having now described my invention, I claim:

1. An electronic component storage album comprising crush resistant front and back covers, with each having integrally formed depending side walls, means for releasably securing said covers together with the side walls integral with the front cover shaped and sized to continuously engage the side walls integral with the back cover when the album is closed forming a space therebetween, and means positioned in said space to releasably engage and secure electronic components.

2. An electronic component storage album as set forth in claim 1 wherein said means positioned in said space comprises an electrically conductive material adapted to engage an releasably secure the prongs of said electronic components and wherein said conductive material comprises a block of foam having a thickness sufficient to receive the length of said prongs.

3. An electronic component storage album as set forth in claim 2 wherein one side of said foam block is secured to the inner side of one of said covers and the other side of said foam block is spaced from the inner side of the other of said covers to at least partially define said space therebetween.

4. An electronic component storage album as set forth in claim 3 wherein one side of said conductive foam block is secured within one of said continuous sidewalls to a cover and with said one continuous sidewall projecting further from the inner side of said cover to which it is attached than said other side of said conductive foam block.

5. An electronic component storage album as set forth in claim 4 wherein said conductive foam block is secured to said back cover.

6. An electronic component storage album as set forth in claim 5, wherein said front cover includes means forming a shoulder within said continuous sidewalls whereby said recess in said front cover has at least on of the longitudinal and width dimensions are shorter than the corresponding dimensions in the recess of said back cover.

7. An electronic component storage album as set forth in claim 6 having means for securing material stored in the recess of said front cover from engagement with electronic components secured to said foam block.

* * * * *